United States Patent [19]
Murray

[11] Patent Number: 4,475,177
[45] Date of Patent: Oct. 2, 1984

[54] NON-VOLATILE SEMICONDUCTOR MEMORY CIRCUITS

[75] Inventor: Kenelm G. D. Murray, Ripley, England

[73] Assignee: Hughes Aircraft Company, El Segundo, Calif.

[21] Appl. No.: 520,744

[22] Filed: Aug. 5, 1983

Related U.S. Application Data

[63] Continuation of Ser. No. 256,647, Apr. 23, 1981, abandoned.

[51] Int. Cl.$^3$ .............................................. G11C 11/40
[52] U.S. Cl. ..................................... 365/182; 365/154
[58] Field of Search ............... 365/149, 154, 155, 156, 365/174, 182, 185, 222, 228, 190, 202

[56] References Cited

U.S. PATENT DOCUMENTS 4,132,904  1/1979  Harari .......................... 365/154 X
4,333,166  6/1982  Edwards ........................... 365/182

Primary Examiner—Joseph A. Popek
Attorney, Agent, or Firm—John Holtrichter, Jr.; A. W. Karambelas

[57] ABSTRACT

A non-volatile semiconductor memory circuit having at least one variable threshold FATMOS transistor in the cross-coupled lateral branches and a plurality of input switching transistors controlling operation of the circuit. Capacitive imbalance between the nodes of the circuit is reduced by having each transistor which is connected between a node and an input switching transistor driven by the same control signal as a corresponding transistor connected between the other node and an input switching transistor. This reduces the occurrence of wrong-state switching in the circuit during reading.

6 Claims, 1 Drawing Figure

NON-VOLATILE SEMICONDUCTOR MEMORY CIRCUITS

This is a continuation of application Ser. No. 256,647, filed Apr. 23, 1981, now abandoned.

FIELD OF INVENTION

This invention relates to non-volatile semiconductor memory circuits.

BACKGROUND OF INVENTION

Semiconductor memories can be classified as volatile (where stored information is lost upon power removal) and non-volatile (where stored information is maintained after power removal, and which can be accurately retrieved after subsequent power-up). Several types of non-volatile semi-conductor memories are known, notably based on MNOS transistors, FAMOS transistors, or FATMOS transistors. A description of prior MNOS and FAMOS memory circuits is given in U.S. Pat. No. 4,132,904. The latter patent, together with U.K. Specification No. 2,000,407 describe and claim FATMOS non-volatile latch memory circuits.

The FATMOS is basically a control gate plus floating gate MOS transistor with a portion of the floating gate lying close to the semiconductor substrate. When the source and drain connections are connected to an appropriate potential (one positive relative to the other) and a suitable potential of a first magnitude applied to the control gate, the transistor conducts. Upon removal of the control gate potential, conduction ceases. If a potential of a second and higher magnitude is applied to the control gate with the drain at zero voltage, the transistor again conducts, but in addition electric charges tunnel between the floating gate and the transistor substrate through the portion of the floating gate closest to the substrate. This charge remains on the floating gate even when the control gate potential is removed and increases the switching threshold of the device. This charge on the floating gate enables the transistor to be employed in a non-volatile memory, as described in U.K. Specification No. 2,00,407. The switching threshold of the FATMOS is returned to its original level by applying between the control gate and drain a potential of approximately the second and higher potential, but of opposite polarity.

In a typical example of an N-channel enhancement-type FATMOS, the area of the floating gate closest to the substrate overlies the drain of the transistors, although this is not essential and the area closest to the substrate can be elsewhere on the transistor. In normal, non-volatile operation of a latch including such a FATMOS device, a voltage of typically +5 to +7 volts is applied to the control gate of the FATMOS. To write non-volatile information into the latch, a voltage of typically +8 to +15 volts is applied to the control gate of the FATMOS. If power is removed from the latch and then subsequently restored, it settles into a logic state dictated by its state during the earlier non-volatile write operation.

Although FATMOS transistors work well when employed in non-volatile memory cells (see U.K. Specification No. 2,000,407) certain configurations of FATMOS transistors can sometimes be unpredictable during reading after the FATMOS's have been placed in their non-volatile written mode (higher threshold state). This unpredictability manifests itself by the FATMOS transistor(s) switching to the wrong state (i.e. a FATMOS with a charge retained on its floating gate being held "off" instead of "on" and vice-versa).

Wrong state switching during reading is particularly noticeable when the shift in the switching threshold of a FATMOS is low, as can occur towards the end of the life of a FATMOS or as a result of normal production variations. The low threshold shift increases the relative effect of other sources of imbalance in the memory cell which may override the effect of the threshold shift and cause the cell to go into the wrong state on reading.

The present invention is concerned with reducing the imbalance in a memory cell due to effects other than those produced by putting the FATMOS devices into their non-volatile modes, so as to improve the reliability of the cell when the threshold shifts are low.

SUMMARY OF THE INVENTION

According to the present invention there is provided a non-volatile semiconductor memory circuit having a pair of cross-coupled branches connectable across a common supply voltage, each branch including a complementary driver or load, a driver connected in series with the complementary driver or load at an output node and a plurality of input switching devices operable by input signals, at least one of said complementary drivers or loads, or drivers including an insulated gate field effect transistor (IGFET) having a threshold voltage which may be varied by raising its gate potential above a predetermined level relative to the potential on one of its electrodes so as to store data in the circuit, wherein a first transistor connected between the output node and an input switching device in one branch is arranged to be in the same state as a corresponding second transistor connected between the output node and an input switching device in the other branch when data stored in the circuit is being read out.

BRIEF DESCRIPTION OF THE DRAWINGS

Preferred features of the invention will now be described with reference to the accompanying drawing given by way of example in which.

DESCRIPTION OF THE PREFERRED EMBODIMENT

Figure 1:
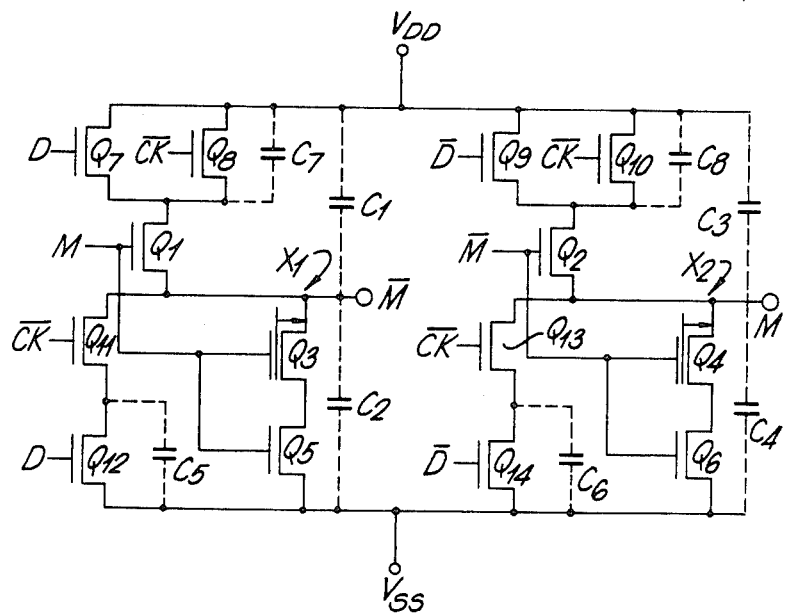
FIG. 1 is an electrical circuit diagram of the memory circuit.

Referring to FIG. 1, there is shown a CMOS non-volatile, flip-flop having P-channel complementary drivers (or loads) $Q_1$, $Q_2$, and N-channel drivers constituted by FATMOS devices $Q_3$, $Q_4$, and their series transistors $Q_5$, $Q_6$. The control gates of the transistors $Q_1$ to $Q_6$ are cross-coupled to the nodes of each opposite branch of the cell, such nodes being indicated as $X_1$ and $X_2$. The signal levels at these nodes set the output signals from the cell M and $\overline{M}$. Input data signals to the cell D, $\overline{D}$ and a clocking signal $\overline{CK}$ control input switching transistors $Q_7$ to $Q_{14}$ to enable data to be written into the cell and read out when required. If the clocking signal $\overline{CK}$ is at its high level, the P-channel transistors $Q_8$, $Q_{10}$ will be "off" and the N-channel transistors $Q_{11}$, $Q_{13}$ will be "on", so that when the data signal D is "high", the P-channel transistor $Q_7$ is "off" and the N-channel transistor $Q_{12}$ is "on", which causes the node $X_1$ to drop to its logic "0" state, and conversely the signal $\overline{D}$ causes the P-channel transistor $Q_9$ to turn "on" and the N-channel transistor $Q_{14}$ to turn "off" allowing the node $X_2$ to go to its logic "1" state. In this way data is put into the cell from the input switching transistors when the clocking signal $\overline{CK}$ is high and can be held in a non-volatile written state by raising the electrode voltages on the FATMOS devices $Q_3$ and $Q_4$ with $\overline{CK0}$ at its "low" level, in the manner described in the above mentioned UK Patent Specification No. 2,000,407.

When the clocking signal $\overline{CK}$ is at its "low" level the P-channel transistors $Q_8$ and $Q_{10}$ are "on" and the N-channel transistor $Q_{11}$ and $Q_{13}$ are "off", so that even if the value of the data signals D, $\overline{D}$ changes the flip-flop transistors $Q_1$ to $Q_2$ remain in the same state.

With the cell in its non-volatile written state one of the FATMOS devices will have a different charge stored on its floating gate than the other FATMOS device.

When voltage is then applied across the voltage rails $V_{DD}$, $V_{SS}$ this difference in charge gives the FATMOS transistors $Q_3$, $Q_4$ different threshold voltages and hence causes one of them to turn on before the other, tipping the flip-flop into the correct state corresponding to the data originally written into the cell.

This data is read out from the cell with the clocking signal $\overline{CK}$ at its "low" level.

However, during power-up, as the voltage rails $V_{DD}$, $V_{SS}$ move apart, any stray capacitance between either of the nodes $X_1$ or $X_2$ and one of the power rails will effect the voltages at the nodes. If the capacitance between node $X_1$ and one of the power rails is different from the capacitance between node $X_2$ and the same power rail then this will produce a voltage difference between the nodes during power-up which may be sufficient to override the difference in threshold voltage between the FATMOS transistors and cause the wrong one to turn on first, thus driving the flip-flop into the wrong state.

One source of stray capacitance in the circuit is the internal capacitance of the interconnections at each junction between transistors. These capacitances connect to the supply rails and combine in the circuit of FIG. 1 to give the effective stray capacitors $C_1$–$C_8$. The size of these stray capacitors depend on the physical parameters of the various transistors and careful control of the design and production of the memory cell can ensure that $C_1$, $C_2$, $C_5$ and $C_7$ are substantially equal to $C_3$, $C_4$, $C_6$ and $C_8$ respectively. Thus the stray capacitors connected directly to the nodes $X_1$, $X_2$ can be balanced so that the capacitance at each node is the same. However, the capacitors $C_7$, $C_8$, $C_5$ and $C_6$ connect to the nodes via transistors $Q_1$, $Q_2$, $Q_{11}$ and $Q_{13}$ and the state of those transistors will therefore effect the capacitance at each node. In FIG. 1, $Q_{11}$ and $Q_{13}$ are both driven by the clocking signal $\overline{CK}$ so that they are always in the same state. Thus the stray capacitances $C_5$ and $C_6$ across the transistors $Q_{12}$ and $Q_{14}$ which are respectively in series with $Q_{11}$ and $Q_{13}$ are either both connected to the respective nodes or both disconnected, and the balance of capacitance at the nodes is maintained. If the transistors $Q_{11}$ and $Q_{13}$ were driven by different signals, such as D and $\overline{D}$ ($Q_{12}$ and $Q_{14}$ being driven by $\overline{CK}$) then an imbalance in the capacitance at the nodes would be introduced which could cause wrongstate switching of the memory cell.

Since $Q_{11}$ and $Q_{13}$ are driven by $\overline{CK}$, they will be both "off" during the read operation, which further ensures that any slight differences between $C_5$ and $C_6$ due to production variations or other factors will not effect the balance between the nodes if the memory cell is switched on in its data reading state.

The stray capacitors $C_7$ and $C_8$ connect to the nodes $X_1$, $X_2$ through the complementary driver or load transistors of the flip-flop $Q_1$ and $Q_2$, and do not effect the operation of the memory cell during reading since the capacitors $C_7$ and $C_8$ are shorted out by $\overline{CK}$ turning $Q_8$ and $Q_{10}$ "on". It will, however, be noted that the transistors $Q_7$, $Q_8$ and $Q_9$ $Q_{10}$ are connected to the nodes $X_1$, $X_2$ through transistors $Q_1$ and $Q_2$ and that since during reading these transistors $Q_1$ and $Q_2$ are initially in the same state any stray capacitance at the gates of transistors $Q_7$ and $Q_9$ will not imbalance the cell. Thus a further source of imbalance is removed by this particular configuration of the transistors $Q_1$, $Q_2$ and $Q_7$ to $Q_{10}$.

The cell shown in FIG. 1 has a CMOS configuration with FATMOS N-channel drivers. The converse configuration with FATMOS P-channel drivers is also possible.

The present invention is of particular benefit when used in combination with the precharging of latch nodes which is the subject of the co-pending U.S. Patent Application No. 101,968, filed Dec. 10, 1979 in the name of Colin Edwards, now U.S. Pat. No. 4,333,166. This precharging mainly concerns the possible problems of imbalance in the stray capacitors $C_1$–$C_4$ and when combined with the present invention produces a further improvement in the reliability of the memory circuit.

In the circuit of FIG. 1 the P-type transistors have their substrates connected to $V_{DD}$ and the N-type transistors have their substrate connected to $V_{SS}$, as is conventional practise in such circuits.

This balancing of the capacitive loading at the nodes is not necessarily restricted to D-type circuits but is of general application in the design of non-volatile memory elements, in particular RAM cells.

I claim:

1. A non-volatile semiconductor memory circuit having a pair of branches, each branch including:

a complementary driver or load ($Q_1$, $Q_2$); an insulated gate field effect transistor (IGFET) driver ($Q_3$, $Q_4$) connected in series with the complementary driver or load, with an output node ($X_1$, $X_2$) of the circuit being at the junction of the IGFET driver with the complementary driver or load;

means for connecting the complementary driver or load ($Q_1$, $Q_2$) and the IGET driver ($Q_3$, $Q_4$) of both branches between a supply voltage ($V_{DD}$, $V_{SS}$); and a plurality of input switches semiconductor devices ($Q_7$–$Q_{14}$) operable by input signals (D, $\overline{D}$, $\overline{CK}$) to the circuit; wherein (1) at least one of said complementary drivers or loads, or IGFET drivers, is an insulating gate field effect transistor (IGFET) having a threshold voltage which may be varied by raising its gate potential above a predetermined level relative to the potential on one of its electrodes so as to store data in the circuit;

(2) the output node on one branch ($X_1$) is connected to a connection to the supply voltage ($V_{SS}$) through a series connection of first ($Q_{11}$) and second ($Q_{12}$) said input switching semiconductor devices, said first ($Q_{11}$) device being adjacent the output node ($X_1$);

(3) the output node of the other branch ($X_2$) is connected to a connection to the supply voltage ($V_{SS}$) through a series connection of third ($Q_{13}$) and fourth ($Q_{14}$) said input switching semiconductor devices, said third device ($Q_{13}$) being adjacent the output node;

(4) said first ($Q_{11}$) and third ($Q_{13}$) devices are arranged to be in the same state when data stored in the circuit is being read out; and (5) the output node of said one branch ($X_1$) being connected to a gate terminal of said IGFET driver ($Q_4$) and the output node of the other branch ($X_2$) being connected to a gate terminal of said IGFET driver ($Q_3$) in the one branch driver ($Q_3$).

2. A circuit as claimed in claim 1 wherein said first ($Q_{11}$) and second ($Q_{12}$) devices are in parallel with the IGFET driver ($Q_3$) of said one branch and said third ($Q_{13}$) and fourth ($Q_{14}$) devices are in parallel with the IGFET driver ($Q_4$) of said other branch.

3. A circuit as claimed in claim 2 wherein said first ($Q_{11}$) and third ($Q_{13}$) devices are operated by a clocking signal ($\overline{CK}$) which controls the transfer of data into the memory circuit and said second ($Q_{12}$) and fourth ($Q_{14}$) devices are operated by data signals (D, D).

4. A circuit as claimed in claim 2 or 3 wherein said one branch has fifth ($Q_7$) and sixth ($Q_8$) input switching semiconductor devices in parallel to one another and in series between the complementary driver or load ($Q_1$) of said one branch and a connection to the supply voltage ($V_{DD}$), and said other branch has seventh ($Q_9$) and eighth ($Q_{10}$) input switching semiconductor devices in parallel to one another and in series between the complementary driver or load ($Q_2$) of said other branch and a connection to the supply voltage ($V_{DD}$), said fifth ($Q_7$), sixth ($Q_8$), seventh ($Q_9$) and eighth ($Q_{10}$) devices being operable by the same input signals ($\overline{D}$, $\overline{CK}$) as used for said first ($Q_{11}$) to fourth ($Q_{14}$) devices.

5. A circuit as claimed in claim 1 wherein said input switching semiconductor devices are MOS transisters.

6. A circuit as claimed in claim 1 wherein one or both of said IGFET drivers are variable threshold IGFETs.

* * * * *